US011751489B2

(12) United States Patent
Finck

(10) Patent No.: US 11,751,489 B2
(45) Date of Patent: Sep. 5, 2023

(54) QUANTUM ENTANGLING GATE BETWEEN MULTI-MODE QUBITS

(71) Applicant: International Business Machines Corporation, Armonk, NY (US)

(72) Inventor: Aaron Finck, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 67 days.

(21) Appl. No.: 17/541,364

(22) Filed: Dec. 3, 2021

(65) Prior Publication Data

US 2023/0180631 A1   Jun. 8, 2023

(51) Int. Cl.
*G06N 10/20* (2022.01)
*H10N 60/12* (2023.01)
*H03K 3/38* (2006.01)

(52) U.S. Cl.
CPC ............ *H10N 60/12* (2023.02); *G06N 10/20* (2022.01); *H03K 3/38* (2013.01)

(58) Field of Classification Search
CPC .................................................. H10N 60/12
USPC ....................................................... 327/366
See application file for complete search history.

(56) References Cited

U.S. PATENT DOCUMENTS

| | | | |
|---|---|---|---|
| 6,900,456 B2 | 5/2005 | Blais et al. | |
| 9,425,804 B2 | 4/2016 | McDermott, III et al. | |
| 9,685,935 B2 | 6/2017 | Strand et al. | |
| 9,858,531 B1 | 1/2018 | Monroe et al. | |
| 10,282,675 B2 | 5/2019 | Bloom et al. | |
| 10,290,916 B2 | 5/2019 | Tobar et al. | |
| 10,347,605 B2 | 7/2019 | Sandberg et al. | |
| 10,353,844 B2 | 7/2019 | Naaman et al. | |
| 2018/0225586 A1 | 8/2018 | Chow et al. | |
| 2018/0226451 A1 | 8/2018 | Dzurak et al. | |
| 2019/0385673 A1 | 12/2019 | Bosman et al. | |
| 2020/0204181 A1 | 6/2020 | Sete et al. | |
| 2020/0327269 A1 | 10/2020 | Pond et al. | |
| 2021/0036206 A1 | 2/2021 | Neill et al. | |
| 2021/0125096 A1 | 4/2021 | Puri et al. | |
| 2021/0218367 A1 | 7/2021 | Berkley et al. | |

FOREIGN PATENT DOCUMENTS

| | | |
|---|---|---|
| WO | 2015178991 A2 | 11/2015 |
| WO | 2019173651 A1 | 9/2019 |
| WO | 2020106313 A1 | 5/2020 |

OTHER PUBLICATIONS

Finck et al, "Suppressed crosstalk between two-junction superconducting qubits with mode-selective exchange coupling", Nov. 23, 2021 (Year: 2021).*
Chu et al, "Coupler-Assisted Controlled-Phase Gate with Enhanced Adiabaticity", Jun. 1, 2021 (Year: 2021).*

(Continued)

*Primary Examiner* — Tomi Skibinski
(74) *Attorney, Agent, or Firm* — Amin, Turocy & Watson, LLP

(57) ABSTRACT

Techniques regarding a quantum entangling gate between multi-mode superconducting qubits are provided. For example, one or more embodiments described herein can comprise an apparatus, which can comprise a first multi-mode superconducting qubit coupled to a second multi-mode superconducting qubit via a transmon qubit.

20 Claims, 10 Drawing Sheets

(56) References Cited

OTHER PUBLICATIONS

Rebic et al. | Giant-Kerr nonlinearities in Circuit-QED. Phys Rev Lett 103, Feb. 2, 2009, DOI:https://doi.org/10.1103/PhysRevLett.103.150503, 4 pages.
Gambetta, J.M. et al. | A superconducting qubit with Purcell protection and tunable coupling. Phys Rev Lett 106, 030502, Jan. 20, 2011, DOI: 10.1103/PhysRevLett.106.030502, 4 pages.
Srinivasan, S. J. et al. | Tunable coupling in circuit quantum electrodynamics with a superconducting V-system. Phys Rev Lett 106, 083601, Feb. 22, 2011, DOI: 10.1103/PhysRevLett.106.083601, 4 pages.
Roy et al. | Implementation of pairwise longitudinal coupling in a multi-junction circuit. Phys Rev Applied 7, Published May 30, 2017, DOI:https://doi.org/10.1103/PhysRevApplied.7.054025, 16 pages.
Ficheux, Q. et al. | Fast logic with slow qubits: microwave-activated controlled-Z gate on low-frequency fluxoniums. Phys. Rev. X 11, 021026, arXiv:2011.02634v1 [quant-ph] Nov. 5, 2020, 17 pages.
Filipp, S. et al. | Multi-mode mediated exchange coupling in cavity QED. Phys. Rev. A 83, 063827, Nov. 2010, arXiv:1011.3732 [quant-ph], 10 pages.
Finck, A. et al. | "Quantum Device Facilitating Suppression of ZZ Interactions between Two-Junction Superconducting Qubits", U.S. Appl. No. 16/917,056, filed Jun. 30, 2020, 59 pages.
Finck, et al., "Quantum Device Facilitating Suppression of ZZ Interactions Between Two-Junction Superconducting Qubits," U.S. Appl. No. 16/917,056, filed Jun. 30, 2020.
Finck, et al., "Driving Dark Modes to Facilitate Entanglement," U.S. Appl. No. 17/409,425, filed Aug. 23, 2021.
Rebic, et al., "Giant Kerr Nonlinearities in Circuit Quantum Electrodynamics," Phys. Rev. Lett. 103, 150503—Published Oct. 8, 2009, DOI: 10.1103/PhysRevLett.103.150503.
Gambetta, et al., "A superconducting qubit with Purcell protection and tunable coupling," Phys. Rev. Lett. 106, 030502 (2011), DOI: 10.1103/PhysRevLett.106.030502.
Srinivasan, et al., "Tunable coupling in circuit quantum electrodynamics with a superconducting V-system," Phys. Rev. Lett. 106, 083601 (2011), DOI: 10.1103/PhysRevLett.106.083601.
Roy, et al., "Implementation of pairwise longitudinal coupling in a three-qubit superconducting circuit," Phys. Rev. Applied 7, 054025 (2017), DOI: 10.1103/PhysRevApplied.7.054025.
D'Arrigo, et al., "Optimal operating conditions of an entangling two-transmon gate," arXiv:1110.0379v2 [cond-mat.supr-con] May 29, 2012.
Ficheux, et al., "Fast logic with slow qubits: microwave-activated controlled-Z gate on low-frequency fluxoniums," Phys. Rev. X 11, 021026 (2021), DOI: 10.1103/PhysRevX.11.021026.
Gambetta et al., "A superconducting qubit with Purcell protection and tunable coupling," Phys Rev Lett 106, 030502, arXiv:1009.4470v1 [cond-mat.mes-hall], Oct. 22, 2018, 4 pages.
Srinivasan et al., "Tunable coupling in circuit quantum electrodynamics with a superconducting V-system," Phys Rev Lett 106, 083601, arXiv:1011.4317v1 [cond-mat.supr-con], Nov. 18, 2010, 5 pages.
Cross et al., "Optimized pulse shapes for a resonator-induced phase gate," Phys Rev A 91, 032325, arXiv:1411.5436v2 [quant-ph], Nov. 11, 2014, 13 pages.
Rebic et al., "Giant-Kerr nonlinearities in Circuit-QED," Phys Rev Lett 103, 150503, arXiv:0902.0402v2 [quant-ph], Oct. 9, 2009, 4 pages.
Roy et al., "Implementation of pairwise longitudinal coupling in a three qubit superconducting circuit," Phys Rev Applied 7, 054025, arXiv:1610.07915v1 [quant-ph], Oct. 26, 2016, 16 pages.
Paik et al., "Experimental demonstration of a resonator-induced phase gate in a multi-qubit circuit QED system," Phys Rev Lett 117, 250502, arXiv:1606.00685v1 [quant-ph], Jun. 3, 2016, 13 pages.
International Search Report and Written Opinion received for PCT Application Serial No. PCT/E P2022/084272 dated Feb. 28, 2023, 14 pages.
Finck A D K et al: "Suppressed crosstalk between two-junction superconducting qubits with mode-selective exchange coupling", arxiv.org, Cornell University Library, 201 Olin Library Cornell University Ithaca, NY14853, Nov. 22, 2021.
Ji Chu et al: "Coupler-Assisted Controlled-Phase Gate with Enhanced Adiabaticity", arxiv.org, Cornell University Library, 201 Olin Library Cornell University Ithaca, NY 14853, Jun. 1, 2021.

* cited by examiner

_US 11,751,489 B2_

QUANTUM ENTANGLING GATE BETWEEN MULTI-MODE QUBITS

BACKGROUND

The subject disclosure relates to one or more quantum entangling gates between two or more multi-mode superconducting qubits, and more specifically, to a transmon coupler between two or more multi-mode superconducting qubits comprising multiple Josephson junctions.

In quantum computing, quantum circuits can employ a plurality of superconducting qubits to execute quantum algorithms. Various operations of the quantum circuits can involve a quantum entanglement between two or more separate superconducting qubits. The quantum entanglement can be established via a quantum entangling gate that can create an entangled state between the two or more separate superconducting qubits using strong microwave drives and/or flux-tunable buses in the quantum circuit.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, apparatuses, devices, and/or methods regarding establishing a quantum entangling gate between multi-mode superconducting qubits via excitation of a transmon coupler are described.

According to an embodiment, an apparatus is provided. The apparatus can comprise a first multi-mode superconducting qubit coupled to a second multi-mode superconducting qubit via a transmon qubit. An advantage of such an apparatus can be a two-qubit gate that can mitigate crosstalk within a quantum circuit.

In some examples, the first multi-mode superconducting qubit and the second multi-mode superconducting qubit can both have a first mode and a second mode. The first mode can correspond to an antisymmetric combination of excitations associated with two Josephson junctions. Also, the second mode can correspond to a symmetric combination of the excitations associated with the two Josephson junctions. An advantage of such an apparatus be the use of the first mode as a computation basis state to facilitate one or more quantum computations.

According to an embodiment, a device is provided. The device can comprise a transmon qubit coupled to a first multi-mode superconducting qubit and a second multi-mode superconducting qubit. The transmon qubit can control a static ZZ interaction between the first multi-mode superconducting qubit and the second multi-mode superconducting qubit. An advantage of such a device can be establishment of a quantum entangling gate between separate superconducting qubits without the need for a strong microwave drive or flux-tunable bus.

In some examples, the first multi-mode superconducting qubit and the second multi-mode superconducting qubit can both have a first mode corresponding to an antisymmetric combination of excitations associated with two Josephson junctions, and a second mode corresponding to a symmetric combination of excitation associated with the two Josephson junction. An advantage of such a device can be enhancement of a ZZ interaction between the first mode of the multi-mode superconducting qubits by controlling an excitement of the transmon qubit.

According to an embodiment, a method is provided. The method can comprise applying a first pulse signal to a transmon qubit to control a quantum entangling gate between a first multi-mode superconducting qubit and a second multi-mode superconducting qubit. An advantage of such a method can be controlling a suppression or enhancement of a ZZ interaction between the first multi-mode superconducting qubit and a second multi-mode superconducting qubit via a transmon qubit coupler.

In some examples, the method can also comprise idling the transmon qubit to enable a static ZZ interaction to form between the first multi-mode superconducting qubit and the second multi-mode superconducting qubit. Further, the method can comprise applying a second pulse signal to the transmon qubit, wherein the second pulse signal can return the transmon qubit to a ground state. An advantage of such a method can be the controlled suppression or enhancement of the ZZ interaction via application of pulse signals to the transmon qubit coupler.

DETAILED DESCRIPTION

Figure 1:
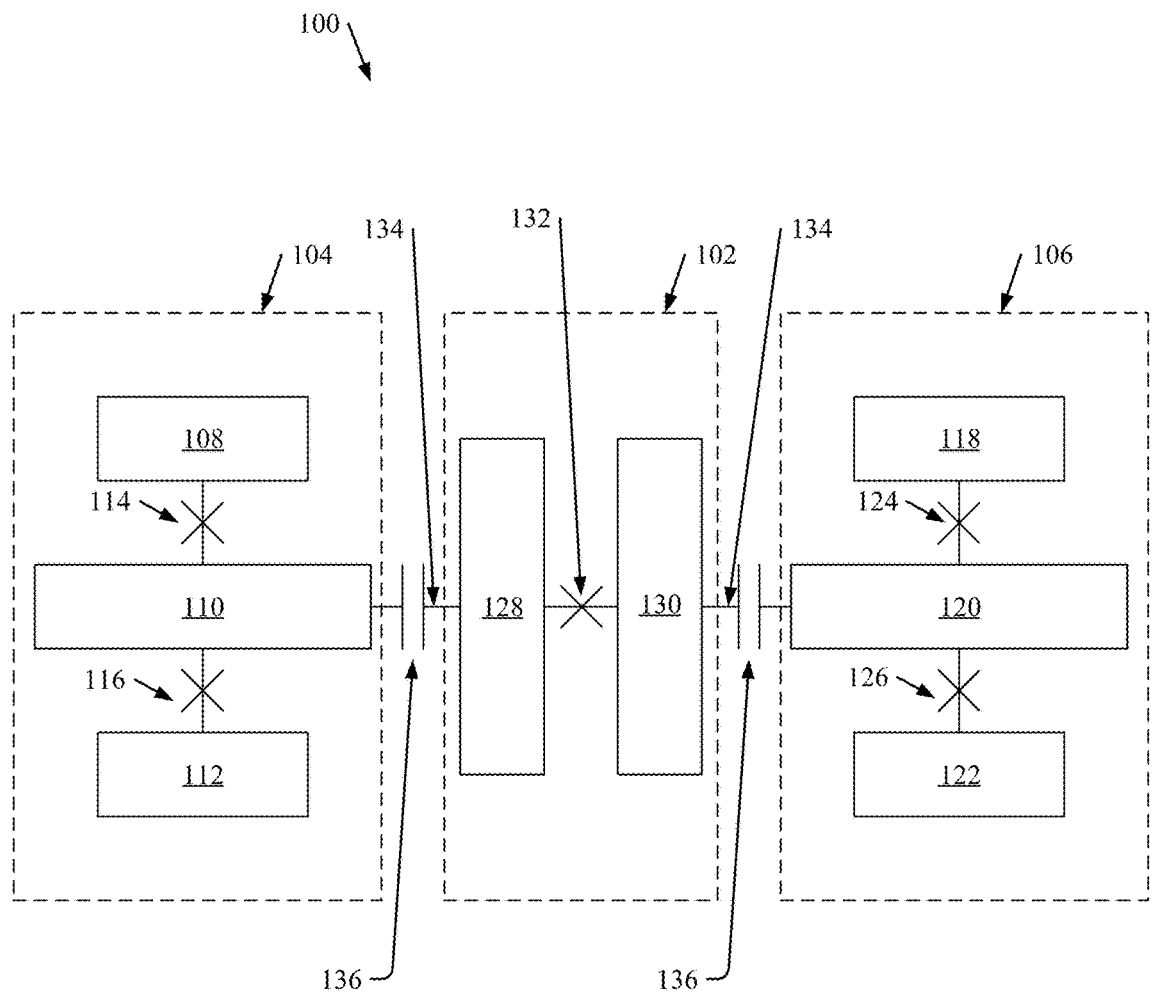
FIG. 1 illustrates a diagram of an example, non-limiting quantum entangling gate structure that can establish a controlled-phase ("CPHASE") gate between multi-mode superconducting qubits via a transmon coupler in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Strong microwave drives can lead to unwanted multi-photon transitions and/or dephasing via heating. Also, flux-tunable buses can be sensitive to flux noise. Given the problems with other implementations of quantum entangling gates; the present disclosure can be implemented to produce a solution to one or more of these problems by coupling a transmon qubit between two or more separate multi-mode superconducting qubits. Advantageously, one or more embodiments described herein can establish a controlled-phase quantum gate between the two or more separate multi-mode superconducting qubits without necessitating a strong microwave drive and/or flux-tunable bus. Further, the static ZZ interaction between the two or more separate multi-mode superconducting qubits can be controlled via excitation or de-excitation of the transmon coupler. Thus, the quantum entangling gate architectures described herein can facilitate low cross-talk between superconducting qubits, while permitting fast and accurate two-qubit entangling gates without the need for strong microwave drives or flux-tunable buses.

Various embodiments described herein can include quantum entangling gates that can control static ZZ interaction between two or more multi-mode superconducting qubits. For example, one or more embodiments can comprise a transmon qubit coupled between a first multi-mode superconducting qubit and a second multi-mode superconducting qubit. For instance, the first and/or second multi-mode superconducting qubits can be tunable coupler qubits ("TCQs"), which can be Josephson junction-based superconducting qubits. The TCQs can have two modes of operation: an A mode that can correspond to an antisymmetric combination of excitations associated with the two Josephson junctions; and a B mode that can correspond to a symmetric combination of excitations associated with two Josephson junctions. The transmon qubit can have a direct exchange coupling with the B mode of the first and/or second TCQs. Further, the transmon qubit can suppress or enhance the static ZZ interaction between the A mode of the first and/or second TCQs based on the excitation state of the transmon qubit.

As described herein, the terms "lithography process" and/or "lithography processes" can refer to the formation of three-dimensional relief images or patterns on a semiconductor substrate for subsequent transfer of the pattern to the substrate. In semiconductor lithography, the patterns can be formed by a light sensitive polymer called a photo-resist. To build the complex structures that make up a semiconductor device and the many wires that connect the various features of a circuit, lithography processes and/or etch pattern transfer steps can be repeated multiple times. Each pattern being printed on the wafer can be aligned to the previously formed patterns and slowly the subject features (e.g., conductors, insulators and/or selectively doped regions) can be built up to form the final device.

As used herein, the term "multi-mode superconducting qubit" and/or "multi-mode superconducting qubits" can refer to one or more superconducting qubits composed of strongly interacting, anharmonic oscillators. Multi-mode superconducting qubits can be characterized by multiple modes of excitations that can exhibit strong longitudinal couplings amongst themselves. For instance, the excitation of one mode can shift the transition frequency of another mode. Multi-mode superconducting qubits can exhibit a ZZ interaction between qubits and/or modes of excitation, in which excitation of one multi-mode superconducting qubit or mode can cause a shift in the transition frequency of another multi-mode superconducting qubit and/or mode. Thereby, the ZZ interaction can enable a quantum entanglements between separate qubits (e.g., between respective multi-mode superconducting qubits). Further, static ZZ interactions can be ZZ interactions present between two or more qubits (e.g., multi-mode superconducting qubits) and/or modes in the absence of external microwave drives. TCQs can exemplify multi-mode superconducting qubits that can be entangled via a transmon coupler in accordance with one or more embodiments described herein.

In various embodiments described herein, superconducting qubits (e.g., such as superconducting quantum interference devices "SQUIDs") can be lithographically defined electronic circuits (e.g., developed via one or more lithography processes) that can be cooled to milli-Kelvin temperatures to exhibit quantized energy levels (e.g., due to quantized states of electronic charge or magnetic flux). Superconducting qubits can be Josephson junction-based, such as transmon qubits and/or the like. Also, superconducting qubits can be compatible with microwave control electronics, and can be utilized with gate-based technology or integrated cryogenic controls.

As described herein, the terms "superconducting" can characterize a material that exhibits superconducting properties at or below a superconducting critical temperature, such as aluminum (e.g., superconducting critical temperature of 1.2 Kelvin) or niobium (e.g., superconducting critical temperature of 9.3 Kelvin). Additionally, one of ordinary skill in the art will recognize that other superconductor materials (e.g., hydride superconductors, such as lithium/magnesium hydride alloys) can be used in the various embodiments described herein.

As described herein, the terms "quantum entangling gate" and/or "quantum entangling gates" can refer to one or more quantum gates that can be driven by external fields (e.g., microwave pulses) to create a quantum entangled state between two or more separate qubits (e.g., multi-mode superconducting qubits). For instance, a controlled-phase ("CPHASE") gate can be an example of a quantum entangling gate, where a first qubit (e.g., a multi-mode superconducting qubit) can acquire a phase-shift if and only if both the first qubit and a second qubit (e.g., another multi-mode superconducting qubit) are in a first excited state. In one or more embodiments, CPHASE gates can employ a ZZ interaction to entangle separate qubits by making a state-dependent shift in qubit frequency equivalent to a state-dependent phase shift.

FIG. 1 illustrates a diagram of an example, non-limiting quantum entangling gate structure 100 that can comprise a transmon coupler 102 between two or more multi-mode superconducting qubits in accordance with one or more embodiments described herein. Repetitive description of like elements employed in other embodiments described herein is omitted for the sake of brevity. As shown in FIG. 1, the quantum entangling gate structure 100 can comprise a first multi-mode superconducting qubit 104 and a second multi-mode superconducting qubit 106. The transmon coupler 102 can be positioned between, and coupled to, the first multi-mode superconducting qubit 104 and the second multi-mode superconducting qubit 106. In one or more embodiments, the first multi-mode superconducting qubit 104 and the second multi-mode superconducting qubit 106 can have the same, or substantially the same, material composition. In one or more embodiments, the first multi-mode superconducting qubit 104 can have a different material composition than the second multi-mode superconducting qubit 106.

In various embodiments, the first multi-mode superconducting qubit 104 can comprise a first superconducting pad 108, a second superconducting pad 110, and/or a third superconducting pad 112. Further, the first multi-mode superconducting qubit 104 can comprise a first Josephson junction 114 and a second Josephson junction 116. For example, the first Josephson junction 114 can be between the first superconducting pad 108 and the second superconducting pad 110. Also, the second Josephson junction 116 can be between the second superconducting pad 110 and the third superconducting pad 112.

In one or more embodiments, the first superconducting pad 108 can comprise one or more superconducting materials; including, but not limited to: niobium, aluminum, tantalum, niobium nitride, a combination thereof, and/or the like. Also, the second superconducting pad 110 can comprise one or more superconducting materials; including, but not limited to: niobium, aluminum, tantalum, niobium nitride, a combination thereof, and/or the like. Further, the third superconducting pad 112 can comprise one or more superconducting materials; including, but not limited to: niobium, aluminum, tantalum, niobium nitride, a combination thereof, and/or the like. In one or more embodiments, the first superconducting pad 108, the second superconducting pad 110, and/or the third superconducting pad 112 can have the same, or substantially the same, material compositions. Alternatively, the first superconducting pad 108, the second superconducting pad 110, and/or the third superconducting pad 112 can have material compositions selected irrespective of each other. For instance, the first superconducting pad 108, the second superconducting pad 110, and/or the third superconducting pad 112 can each comprise a different material composition of superconducting materials. In another instance, two of the superconducting pads (e.g., the first superconducting pad 108, the second superconducting pad 110, and/or the third superconducting pad 112) can have the same, or substantially the same, material composition; while the third superconducting pad (e.g., the first superconducting pad 108, the second superconducting pad 110, and/or the third superconducting pad 112) can have a different material composition than the other two superconducting pads.

Likewise, in various embodiments, the second multi-mode superconducting qubit 106 can comprise a fourth superconducting pad 118, a fifth superconducting pad 120, and/or a sixth superconducting pad 122. Further, the second multi-mode superconducting qubit 106 can comprise a third Josephson junction 124 and a fourth Josephson junction 126. For example, the third Josephson junction 124 can be between the fourth superconducting pad 118 and the fifth superconducting pad 120. Also, the fourth Josephson junction 126 can be between the fifth superconducting pad 120 and the sixth superconducting pad 122.

In one or more embodiments, the fourth superconducting pad 118 can comprise one or more superconducting materials; including, but not limited to: niobium, aluminum, tantalum, niobium nitride, a combination thereof, and/or the like. Also, the fifth superconducting pad 120 can comprise one or more superconducting materials; including, but not limited to: niobium, aluminum, tantalum, niobium nitride, a combination thereof, and/or the like. Further, the sixth superconducting pad 122 can comprise one or more superconducting materials; including, but not limited to: niobium, aluminum, tantalum, niobium nitride, a combination thereof, and/or the like. In one or more embodiments, the fourth superconducting pad 118, the fifth superconducting pad 120, and/or the sixth superconducting pad 122 can have the same, or substantially the same, material compositions. Alternatively, the fourth superconducting pad 118, the fifth superconducting pad 120, and/or the sixth superconducting pad 122 can have material compositions selected irrespective of each other. For instance, the fourth superconducting pad 118, the fifth superconducting pad 120, and/or the sixth superconducting pad 122 can each comprise a different material composition of superconducting materials. In another instance, two of the superconducting pads (e.g., the fourth superconducting pad 118, the fifth superconducting pad 120, and/or the sixth superconducting pad 122) can have the same, or substantially the same, material composition; while the third superconducting pad (e.g., the fourth superconducting pad 118, the fifth superconducting pad 120, and/or the sixth superconducting pad 122) can have a different material composition than the other two superconducting pads. In various embodiments, the quantum entangling gate structure 100 can further comprise multiple second multi-mode superconducting qubits 106 (e.g., each capacitively coupled to the transmon coupler 102).

As shown in FIG. 1, the transmon coupler 102 can be a transmon qubit coupled (e.g., capacitively) to the second superconducting pad 110 of the first multi-mode superconducting qubit 104 and the fifth superconducting pad 120 of the second multi-mode superconducting qubit 106 (e.g., the middle superconducting pads). For instance, the transmon coupler 102 can comprise a left superconducting pad 128, a right superconducting pad 130, and/or a fifth Josephson junction 132. The first multi-mode superconducting qubit 104 can be coupled (e.g., capacitively) to a first superconducting pad (e.g., the left superconducting pad 128, as shown in FIG. 1) of the transmon coupler 102. Further, the second multi-mode superconducting qubit 106 can be coupled (e.g., capacitively) to a second superconducting pad (e.g., the right superconducting pad 130, as shown in FIG. 1) of the transmon coupler 102.

In one or more embodiments, the left superconducting pad 128 can comprise a superconducting material, including but not limited to: aluminum, niobium, tantalum, niobium nitride, a combination thereof, and/or the like. Also, in one or more embodiments, the right superconducting pad 130 can comprise a superconducting material, including but not limited to: aluminum, niobium, tantalum, niobium nitride, a combination thereof, and/or the like. In various embodiments, the left superconducting pad 128 and the right superconducting pad 130 can have the same or different material compositions. As shown in FIG. 1, the transmon coupler 102 can comprise the fifth Josephson junction 132 (e.g., represented by an "X") between the left superconducting pad 128 and the right superconducting pad 130.

In various embodiments, the transmon coupler 102 can be coupled to the first multi-mode superconducting qubit 104 and the second multi-mode superconducting qubit 106 via one or more transmission lines 134. The one or more transmission lines 134 can be, for example, one or more microwave resonators, co-planar waveguides, and/or the like. In one or more embodiments, the transmon coupler 102 can be capacitively coupled to the first multi-mode superconducting qubit 104 and the second multi-mode superconducting qubit 106 via one or more capacitors 136 (e.g., as shown in FIG. 1). For instance, the left superconducting pad 128 of the transmon coupler 102 can be capacitively coupled to the second superconducting pad 110 of the first multi-mode superconducting qubit 104. Additionally, the right superconducting pad 130 of the transmon coupler 102 can be capacitively coupled to the fifth superconducting pad 120 of the second multi-mode superconducting qubit 106. In one or more embodiments, the transmon coupler 102 can exhibit a capacitance ranging from, for example, greater than or equal to 65 femtofarad (fF) and less than or equal to 150 fF (e.g., 70 fF). Further, a coupling capacitance established between the transmon coupler 102 and the first multi-mode superconducting qubit 104 and/or the second multi-mode superconducting qubit 106 can range from, for example, greater than or equal to 2 fF and less than or equal to 10 fF (e.g., 5 fF).

Figure 2:
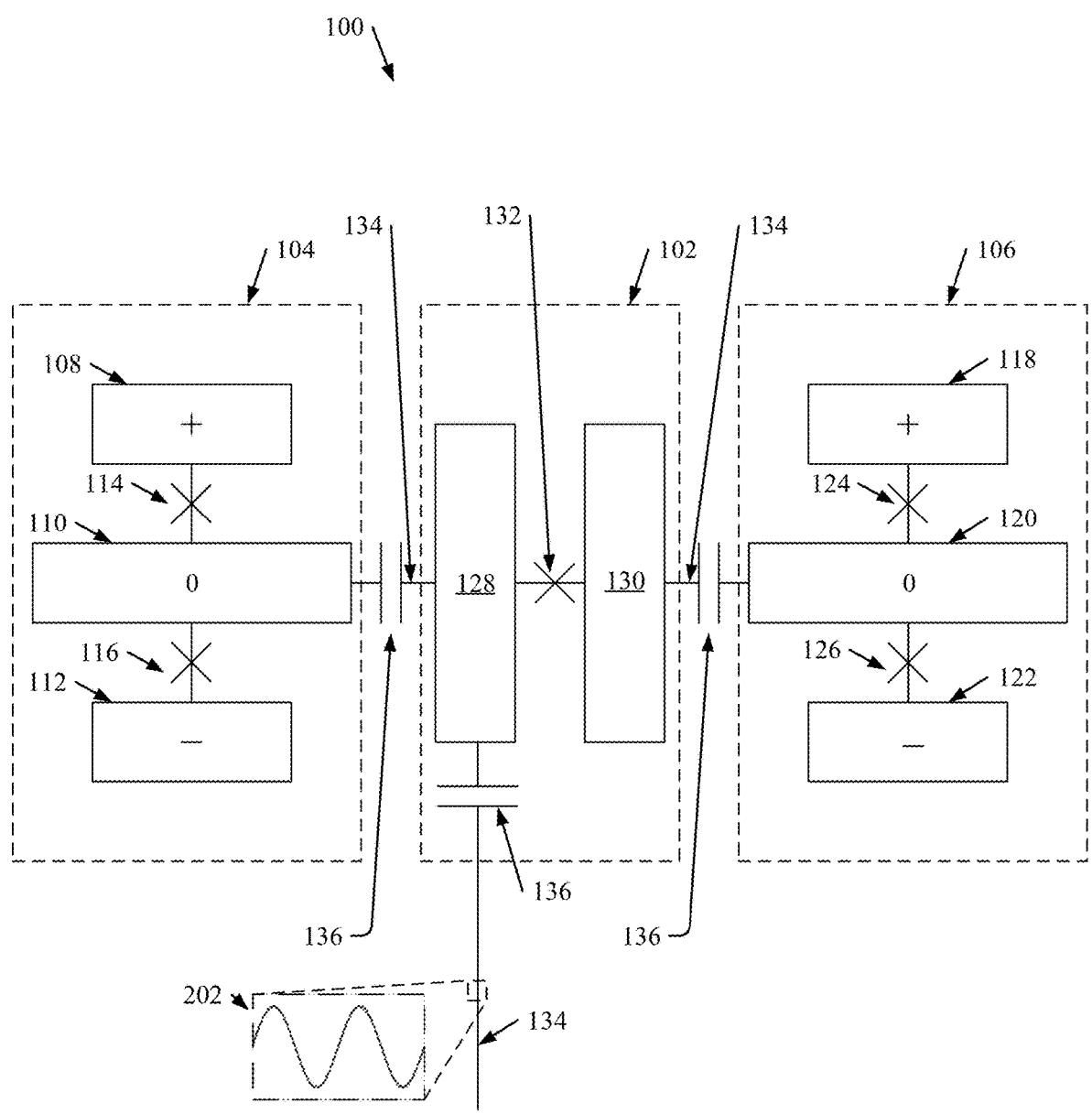
FIG. 2 illustrates a diagram of an example, non-limiting quantum entangling gate structure comprising a transmon coupler between multi-mode superconducting qubits having a first mode of excitation in accordance with one or more embodiments described herein.

FIG. 2 illustrates a diagram of the example, non-limiting quantum entangling gate structure 100, where the first multi-mode superconducting qubit 104 and the second multi-mode superconducting qubit 106 can have an A mode of excitation associated with the Josephson junctions. Repetitive description of like elements employed in other embodiments described herein is omitted for the sake of brevity. As shown in FIG. 2, "+" can denote an accumulation of positive electrical charge on the given superconducting pad, "−" can denote an accumulation of negative electrical charge on the given superconducting pad, and/or "0" can denote no net electrical charge on the given superconducting pad. For example, the first multi-mode superconducting qubit 104 can exhibit the A mode of excitations associated with the first Josephson junction 114 and the second Josephson junction 116, where the first multi-mode superconducting qubit 104 can achieve an antisymmetric accumulation of electrical charges. Likewise, the second multi-mode superconducting qubit 106 can exhibit the A mode of excitations associated with the third Josephson junction 124 and the fourth Josephson junction 126, where the second multi-mode superconducting qubit 106 can achieve an antisymmetric accumulation of electrical charges. In one or more embodiments, the A modes of the first multi-mode superconducting qubit 104 and/or the second multi-mode superconducting qubit 106 can be employed as computational basis states to facilitate one or more quantum computations.

As shown in FIG. 2, while the A mode is excited, the second superconducting pad 110 can be in a ground state (e.g., no net electrical charge, as denoted by "0" in FIG. 2). In contrast, one of the first superconducting pad 108 or the third superconducting pad 112 can have a positive electrical charge state (e.g., denoted by "+" in FIG. 2). Where the first superconducting pad 108 has a positive electrical charge (e.g., denoted by "+" in FIG. 2), the third superconducting pad 112 can have a negative electrical charge (e.g., denoted by "−" in FIG. 2). Where the third superconducting pad 112 has a positive electrical charge (e.g., denoted by "+" in FIG. 2), the first superconducting pad 108 can have a negative electrical charge (e.g., denoted by "−" in FIG. 2). Thus, while in the A mode is excited, the first superconducting pad 108 and the third superconducting pad 112 can experience excess accumulation of opposite electrical charges, while the second superconducting pad 110 can experience no net electrical charge accumulation.

Also, while the A mode is excited, the fifth superconducting pad 120 can be in a ground state (e.g., no net electrical charge, as denoted by "0" in FIG. 2). In contrast, one of the fourth superconducting pad 118 or the sixth superconducting pad 122 can have a positive electrical charge (e.g., denoted by "+" in FIG. 2). Where the fourth superconducting pad 118 has a positive electrical charge (e.g., denoted by "+" in FIG. 2), the sixth superconducting pad 122 can have a negative electrical charge (e.g., denoted by "−" in FIG. 2). Where the sixth superconducting pad 122 has a positive electrical charge state (e.g., denoted by "+" in FIG. 2), the fourth superconducting pad 118 can have a negative electrical charge (e.g., denoted by "−" in FIG. 2). Thus, while the A mode is excited, the fourth superconducting pad 118 and the sixth superconducting pad 122 can experience excess accumulation of opposite electrical charges, while the fifth superconducting pad 120 can experience no net electrical charge accumulation.

Figure 3:
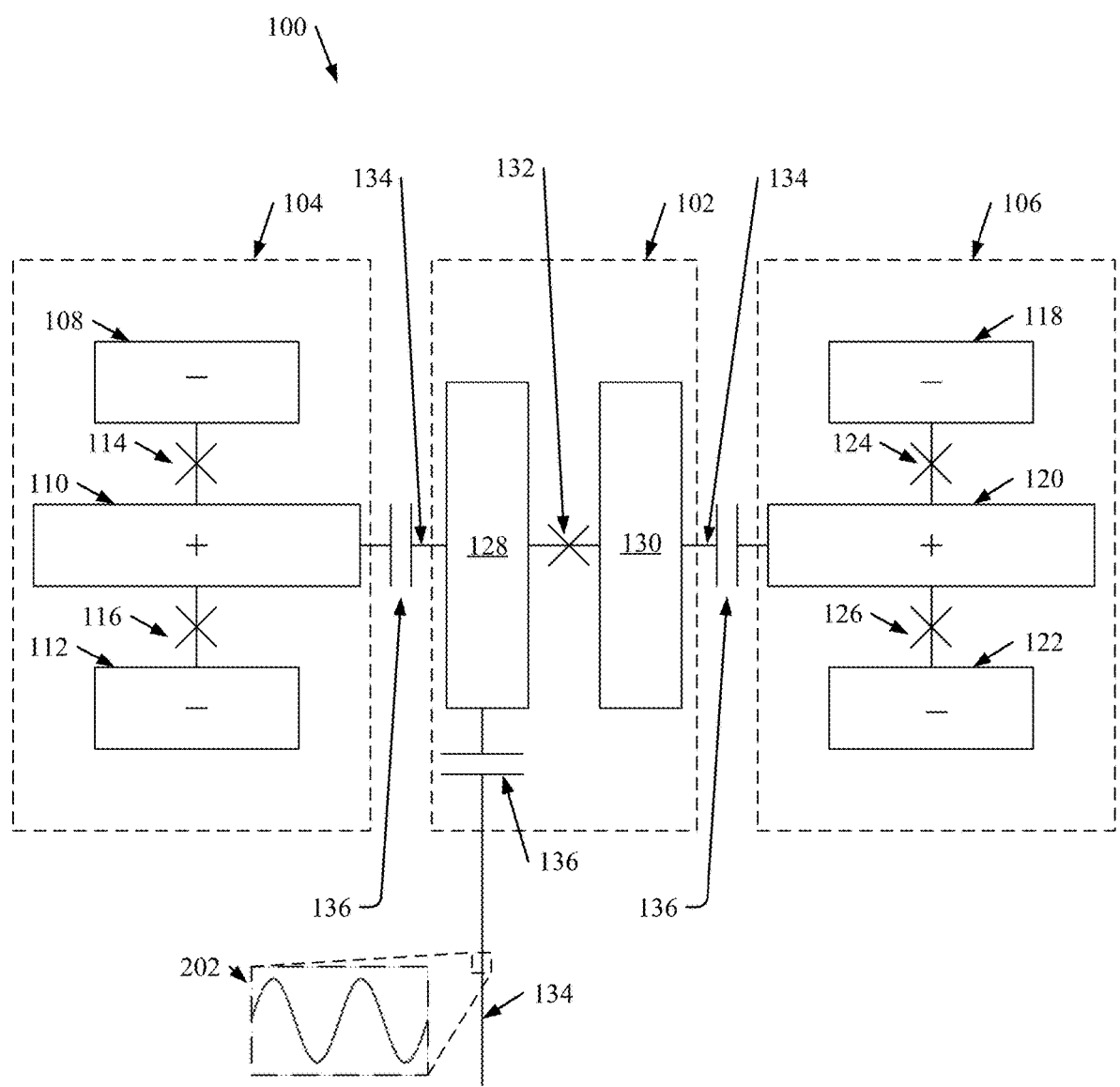
FIG. 3 illustrates a diagram of an example, non-limiting quantum entangling gate comprising a transmon coupler between multi-mode superconducting qubits having a second mode of excitation in accordance with one or more embodiments described herein.

FIG. 3 illustrates a diagram of the example, non-limiting quantum entangling gate structure 100, where the first multi-mode superconducting qubit 104 and the second multi-mode superconducting qubit 106 can have a B mode of excitations associated with the Josephson junctions. Repetitive description of like elements employed in other embodiments described herein is omitted for the sake of brevity. As shown in FIG. 3, "+" can denote an accumulation of positive electrical charge on the given superconducting pad, "−" can denote an accumulation of negative electrical charge on the given superconducting pad. For example, the first multi-mode superconducting qubit 104 can exhibit the B mode of excitations associated with the first Josephson junction 114 and the second Josephson junction 116, where the first multi-mode superconducting qubit 104 can achieve a symmetric accumulation of electrical charge. Likewise, the second multi-mode superconducting qubit 106 can exhibit the B mode of excitations associated with the third Josephson junction 124 and the fourth Josephson junction 126, where the second multi-mode superconducting qubit 106 can achieve a symmetric accumulation of electrical charge. In one or more embodiments, the transmon coupler 102 can be capacitively coupled to the first multi-mode superconducting qubit 104 and the second multi-mode superconducting qubit 106 to establish a direct exchange coupling between the transmon coupler 102 and the B modes of the first multi-mode superconducting qubit 104 and the second multi-mode superconducting qubit 106.

As shown in FIG. 3, while the B mode is excited, the second superconducting pad 110 can be electrically charged. For example, the first superconducting pad 108 and the third superconducting pad 112 can have excess accumulations of alike electrical charges; thereby, the second superconducting pad 110 can achieve a net electrical charge opposite that of the first superconducting pad 108 and the third superconducting pad 112. For instance, where the first superconducting pad 108 and the third superconducting pad 112 have a negative electrical charge (e.g., denoted by "−" in FIG. 3), the second superconducting pad 110 can have a net positive electrical charge (e.g., denoted by "+" in FIG. 3). In another instance, where the first superconducting pad 108 and the third superconducting pad 112 have a positive electrical charge, the second superconducting pad 110 can have a net negative electrical charge.

Also, while the B mode is excited, the fifth superconducting pad 120 can be electrically charged. For example, the fourth superconducting pad 118 and the sixth superconducting pad 122 can have excess accumulations of alike electrical charges; thereby, the fifth superconducting pad 120 can achieve a net electrical charge opposite that of the fourth superconducting pad 118 and the sixth superconducting pad 122. For instance, where the fourth superconducting pad 118 and the sixth superconducting pad 122 have a negative electrical charge (e.g., denoted by "−" in FIG. 3), the fifth superconducting pad 120 can have a net positive electrical charge (e.g., denoted by "+" in FIG. 3). In another instance, where the fourth superconducting pad 118 and the sixth superconducting pad 122 have a positive electrical charge, the fifth superconducting pad 120 can have a net negative electrical charge.

The accumulation of electrical charge on a given superconducting pad can switch rapidly between, for example, positive and negative electrical charges as electrical current flows back and forth across the Josephson junctions (e.g., first Josephson junction 114, second Josephson junction 116, third Josephson junction 124, and/or fourth Josephson junction 126). The electrical charge signs (e.g., "+", "−", and/or "0") shown in FIGS. 2-3 can denote electrical charges at a moment in time. As shown in FIGS. 2-3, the transmon coupler 102 can be driven by one or more microwave signals 202 (e.g., pi pulses) to control the excitation state of the transmon coupler 102. Where the transmon coupler 102 is in a ground state, the static ZZ interaction between the A modes of the first multi-mode superconducting qubit 104 and the A mode of the second multi-mode superconducting qubit 106 can be suppressed by the transmon coupler 102. Where the transmon coupler 102 is in an excited state, the static ZZ interaction between the A modes of the first multi-mode superconducting qubit 104 and the A mode of the second multi-mode superconducting qubit 106 can be enhanced; thereby enabling a CPHASE gate between the first multi-mode superconducting qubit 104 and the second multi-mode superconducting qubit 106.

Figure 4:
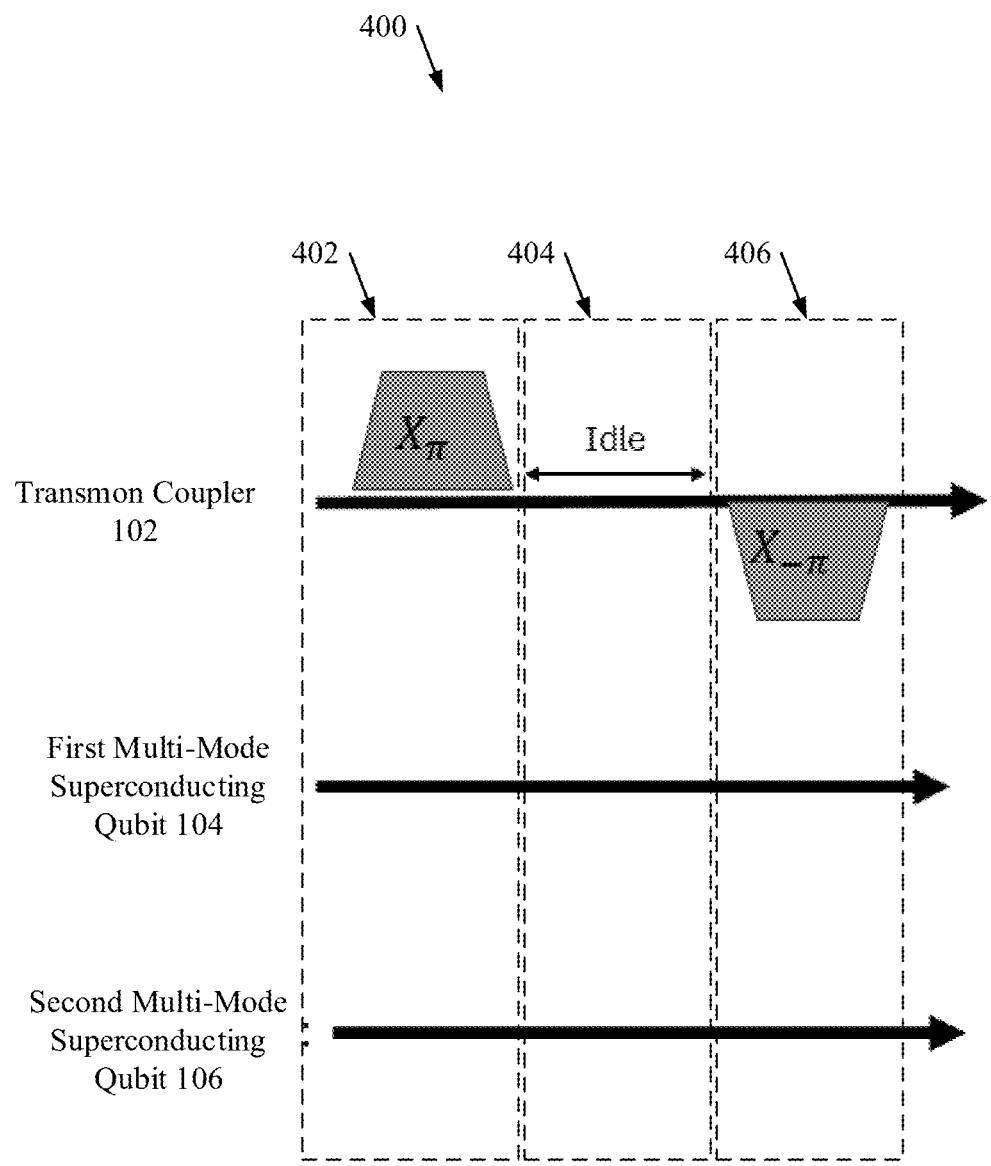
FIG. 4 illustrates a diagram of an example, non-limiting pulse sequence that can effectuate a quantum entangling gate between multi-mode superconducting qubits using a transmon coupler in accordance with one or more embodiments described herein.

FIG. 4 illustrates a diagram of an example, non-limiting pulse sequence scheme 400 that can be employed to control the static ZZ interaction between the A modes of the first multi-mode superconducting qubit 104 and the second multi-mode superconducting qubit 106 in accordance with one or more embodiments described herein. Repetitive description of like elements employed in other embodiments described herein is omitted for the sake of brevity. In various embodiments, the transmon coupler 102 can be driven in accordance with the example pulse sequence scheme 400 to control suppression and/or enhancement of the static ZZ interaction between the A modes of the first multi-mode superconducting qubit 104 and the second multi-mode superconducting qubit 106. For example, the one or more microwave signals 202 can be applied to the transmon coupler 102 in accordance with the example pulse sequence scheme 400.

In a first stage 402 of the example pulse sequence scheme 400, a pi pulse (e.g., denoted by "$X_\pi$" in FIG. 4) can be applied to the transmon coupler 102. The pi pulse can put the transmon coupler 102 into an excited state (e.g., an excited positive state) that can enhance the static ZZ interaction between the A modes of the first multi-mode superconducting qubit 104 and the second multi-mode superconducting qubit 106. In a second stage 404 of the example pulse sequence scheme 400, the transmon coupler 102 can be left to idle in the excited state to facilitate quantum entanglement between the first multi-mode superconducting qubit 104 and the second multi-mode superconducting qubit 106. In a third stage 406 of the example pulse sequence scheme 400, an inverse of the pi pulse (e.g., a negative pi pulse, denoted by "$X_{-\pi}$" in FIG. 4) can be applied to the transmon coupler 102. The inverse pi pulse can return the transmon coupler 102 to a ground state. While the transmon coupler 102 is in the ground state, the transmon coupler 102 can suppress the static ZZ interaction between the A modes of the first multi-mode superconducting qubit 104 and the second multi-mode superconducting qubit 106. Thereby, the quantum entangling gate structure 100 can serve as a CPHASE gate between the first multi-mode superconducting qubit 104 and the second multi-mode superconducting qubit 106.

Figure 5:
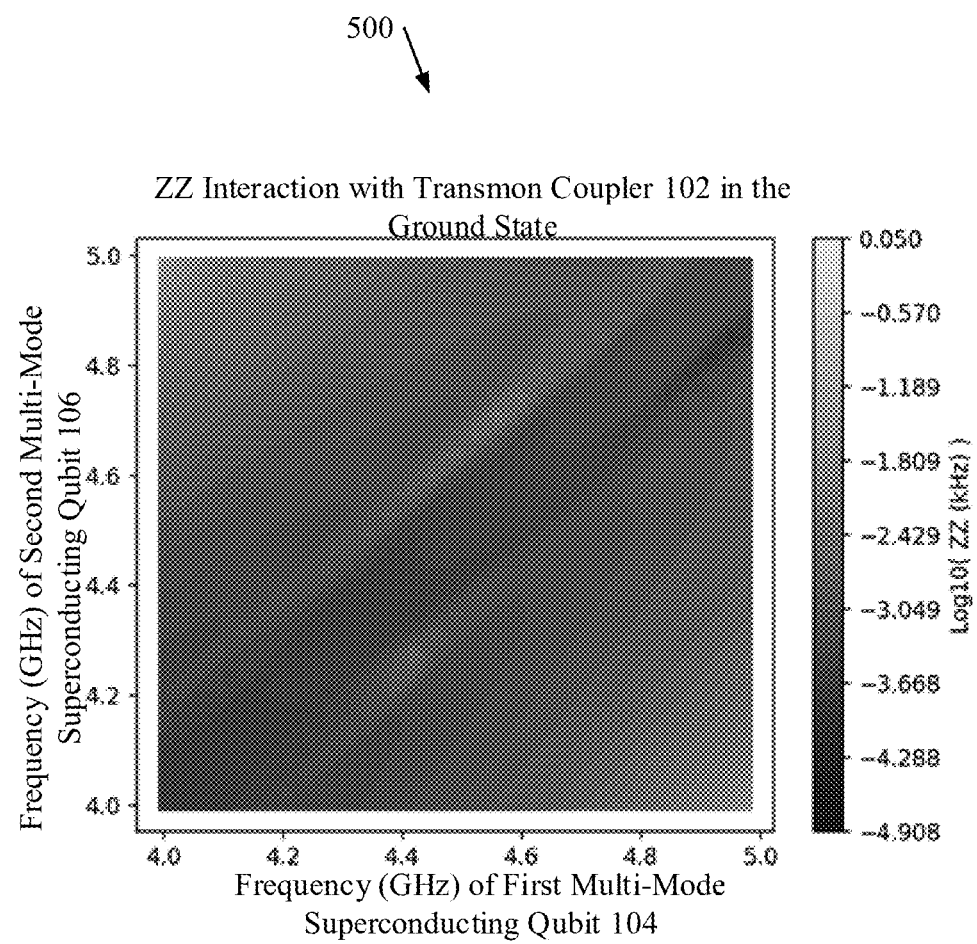
FIG. 5 illustrates a diagram of an example, non-limiting graph that can characterize the static ZZ interaction between two separate multi-mode superconducting qubits while a transmon coupler is in a ground state in accordance with one or more embodiments described herein.
Figure 6:
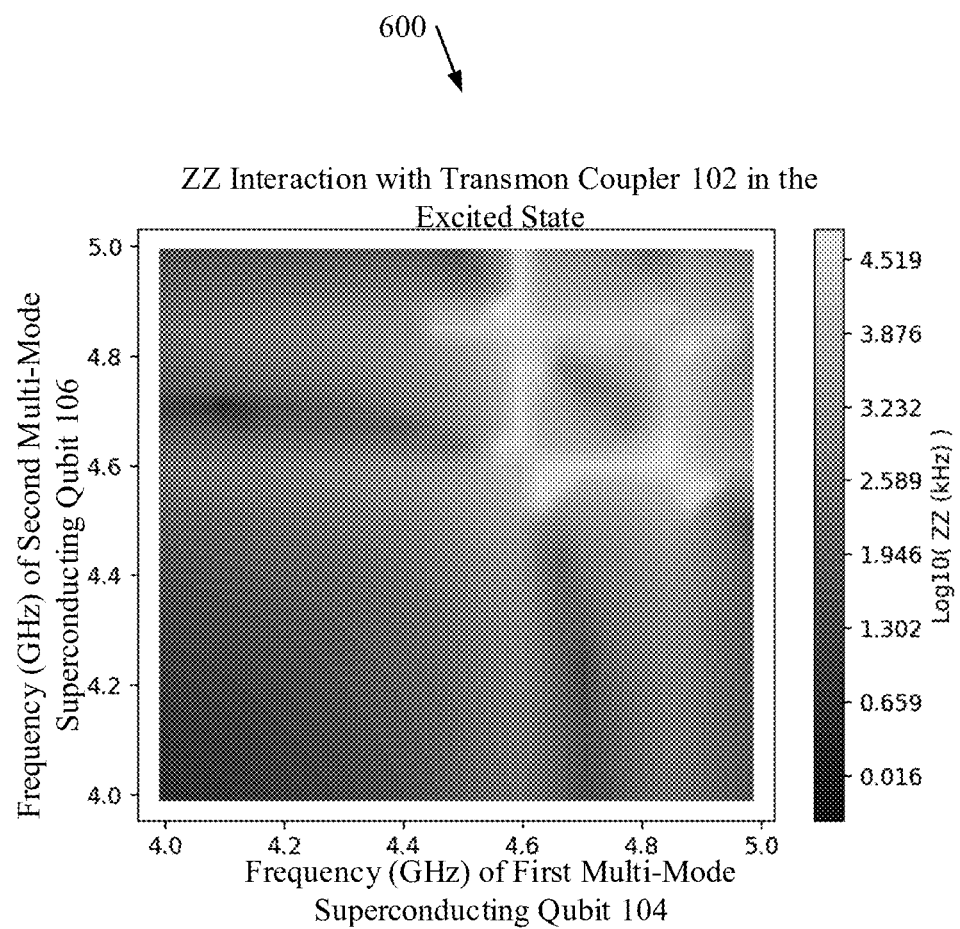
FIG. 6 illustrates a diagram of an example, non-limiting graph that can characterize the static ZZ interaction between two separate multi-mode superconducting qubits while a transmon coupler is in an excited state in accordance with one or more embodiments described herein.

FIGS. 5-6 illustrate diagrams of an example, non-limiting graphs 500, 600 that can depict how the state of the transmon coupler 102 can affect the static ZZ interaction between the first multi-mode superconducting qubit 104 and the second multi-mode superconducting qubit 106 in accordance with one or more embodiments described herein. Repetitive description of like elements employed in other embodiments described herein is omitted for the sake of brevity. Graphs 500 and/or 600 can depict the static ZZ interaction between the A modes of the first multi-mode superconducting qubit 104 and the second multi-mode superconducting qubit 106 across a range of frequencies. The frequency of the first multi-mode superconducting qubit 104 and/or the second multi-mode superconducting qubit 106 can be a function of the magnitude of the Josephson junction critical currents employed in the respective qubits.

Graph 500 depicts the static ZZ interaction between the first multi-mode superconducting qubit 104 and the second multi-mode superconducting qubit 106 when the transmon coupler 102 is in the ground state. As shown in graph 500, the static ZZ interaction can remain low when the transmon coupler 102 is in the ground state. Graph 600 depicts the ZZ interaction between the first multi-mode superconducting qubit 104 and the second multi-mode superconducting qubit 106 when the transmon coupler 102 is in an excited state. As shown in graph 600, the static ZZ interaction can be enhanced when the transmon coupler 102 is in the excited state. For instance, excitation of the transmon coupler 102 can enhance the static ZZ interaction between the first multi-mode superconducting qubit 104 and the second multi-mode superconducting qubit 106, where the first multi-mode superconducting qubit 104 and the second multi-mode superconducting qubit 106 have frequencies between, for example, 4.6 and 5.0 gigahertz (GHz).

Figure 7:
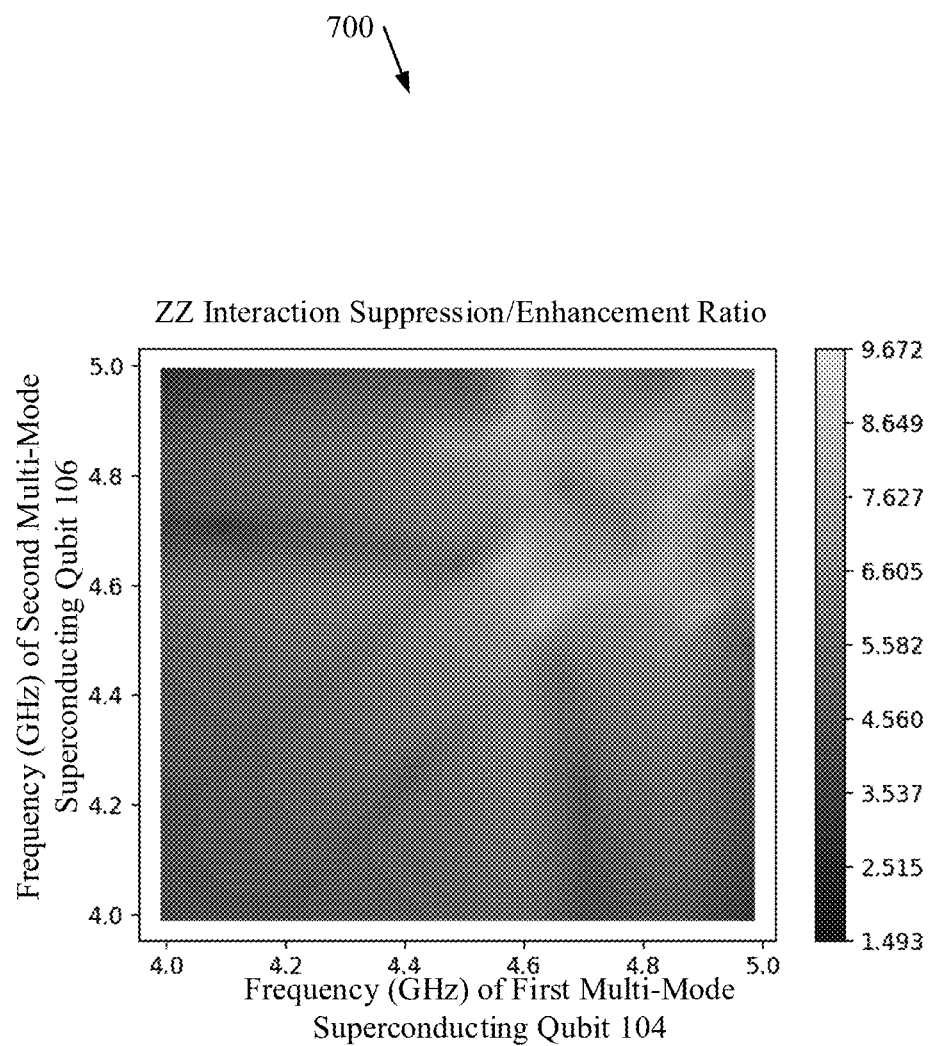
FIG. 7 illustrates a diagram of an example, non-limiting graph that can characterize static ZZ interaction suppression/enhancement ratio between two separate multi-mode superconducting qubits coupled via a transmon qubit in accordance with one or more embodiments described herein.

FIG. 7 illustrates a diagram of an example, non-limiting graph 700 that can characterize the static ZZ interaction enhancement that can be achieved by exciting the transmon coupler 102 in accordance with one or more embodiments described herein. Repetitive description of like elements employed in other embodiments described herein is omitted for the sake of brevity. Graph 700 depicts a ratio of the static ZZ interaction between the A modes of the first multi-mode superconducting qubit 104 and the second multi-mode superconducting qubit 106 when the transmon coupler 102 is in the ground state to when the transmon coupler 102 is in the excited state. As shown in graph 700, the static ZZ interaction can be controlled over a wide range of operating frequencies via excitation or de-excitation of the transmon coupler 102.

Figure 8:
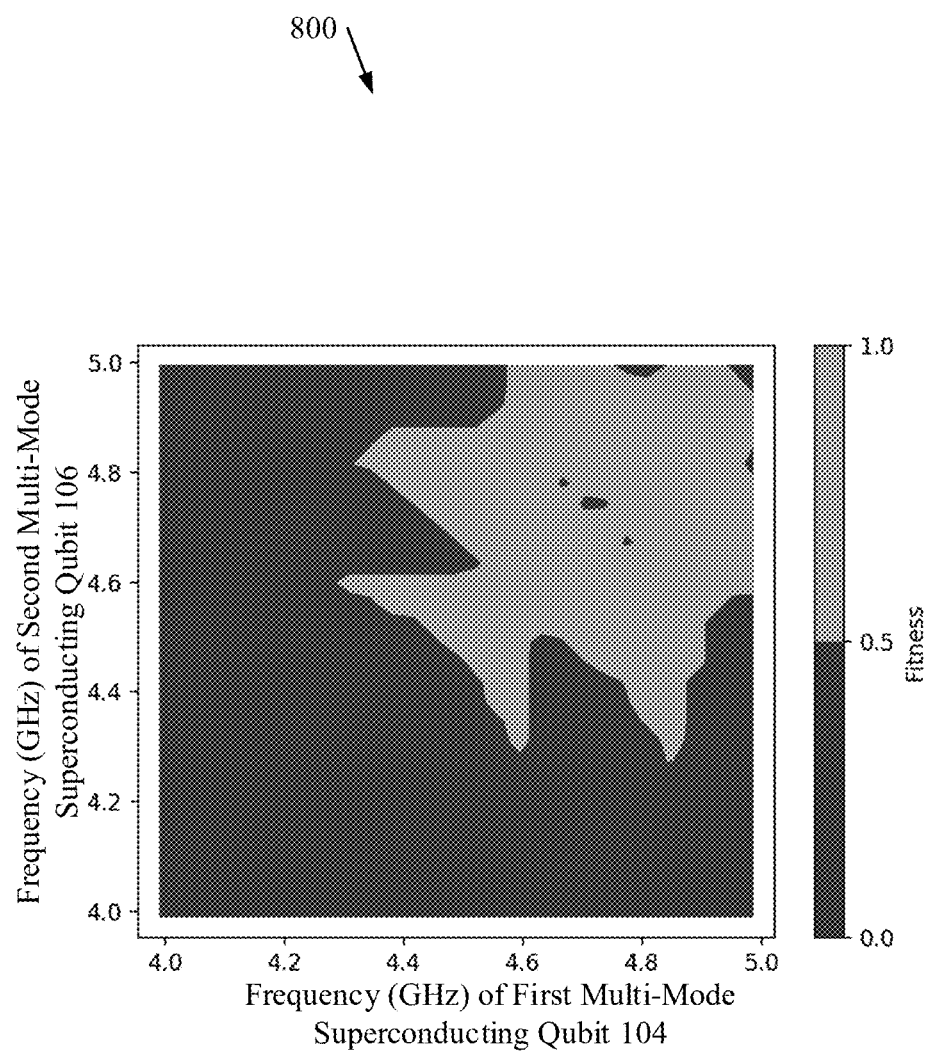
FIG. 8 illustrates a diagram of an example, non-limiting graph that can characterize a parameter region in which static ZZ interaction between two multi-mode superconducting qubits can be controlled via a transmon coupler in accordance with one or more embodiments described herein.

FIG. 8 illustrates a diagram of an example, non-limiting graph 800 that can characterize a parameter space in which the static ZZ interaction between the first multi-mode superconducting qubit 104 and the second multi-mode superconducting qubit 106 is suppressed or enhanced in accordance with one or more embodiments described herein. Repetitive description of like elements employed in other embodiments described herein is omitted for the sake of brevity. The light shading in graph 800 can represent a region of operating frequencies associated with a static ZZ interaction (e.g., between the A modes of the first multi-mode superconducting qubit 104 and the second multi-mode superconducting qubit 106) that is less than 10 kilohertz (kHz) when the transmon coupler 102 is in the ground state and greater than 1 megahertz (MHz) when the transmon coupler 102 is in the excited state. Thereby, the light shading in graph 800 can denote a parameter region in which the quantum entangling gate structure 100 can mitigate crosstalk between superconducting qubits while also providing a fast two-qubit gate.

Figure 9:
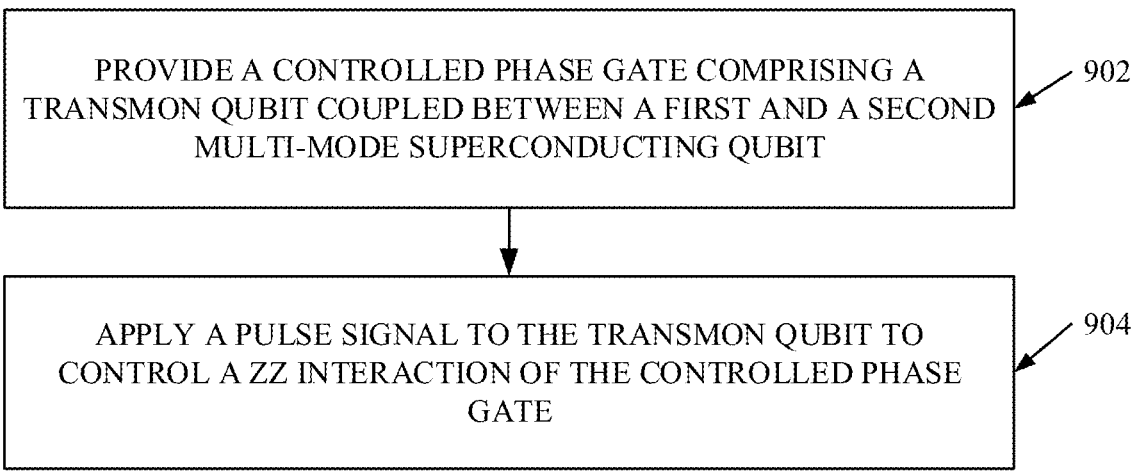
FIG. 9 illustrates a flow diagram of an example, non-limiting method that can facilitate controlling a static ZZ interaction between separate multi-mode superconducting qubits via a transmon coupler in accordance with one or more embodiments described herein.

FIG. 9 illustrates a flow diagram of an example, non-limiting method 900 that can facilitate controlling the static ZZ interaction between coupled multi-mode superconducting qubits (e.g., the first multi-mode superconducting qubit 104 and the second multi-mode superconducting qubit 106) in accordance with one or more embodiments described herein. Repetitive description of like elements employed in other embodiments described herein is omitted for the sake of brevity.

At 902, the method 900 can comprise providing a CPHASE gate comprising a transmon qubit (e.g., transmon coupler 102) coupled between a first multi-mode superconducting qubit 104 and a second multi-mode superconducting qubit 106. For example, the CPHASE gate provided at 902 can have the architecture of the quantum entangling gate structure 100 described herein. At 904, the method 900 can comprise applying a pulse signal (e.g., a microwave signal 202) to the transmon qubit (e.g., transmon coupler 102) to control a ZZ interaction of the CPHASE gate. For example, the pulse signal can excite or de-excite the transmon qubit (e.g., transmon coupler 102). Further, a static ZZ interaction between the A modes of the first multi-mode superconducting qubit 104 and the second multi-mode superconducting qubit 106 can be suppressed or enhanced based on the state of the transmon qubit (e.g., transmon coupler 102).

Figure 10:
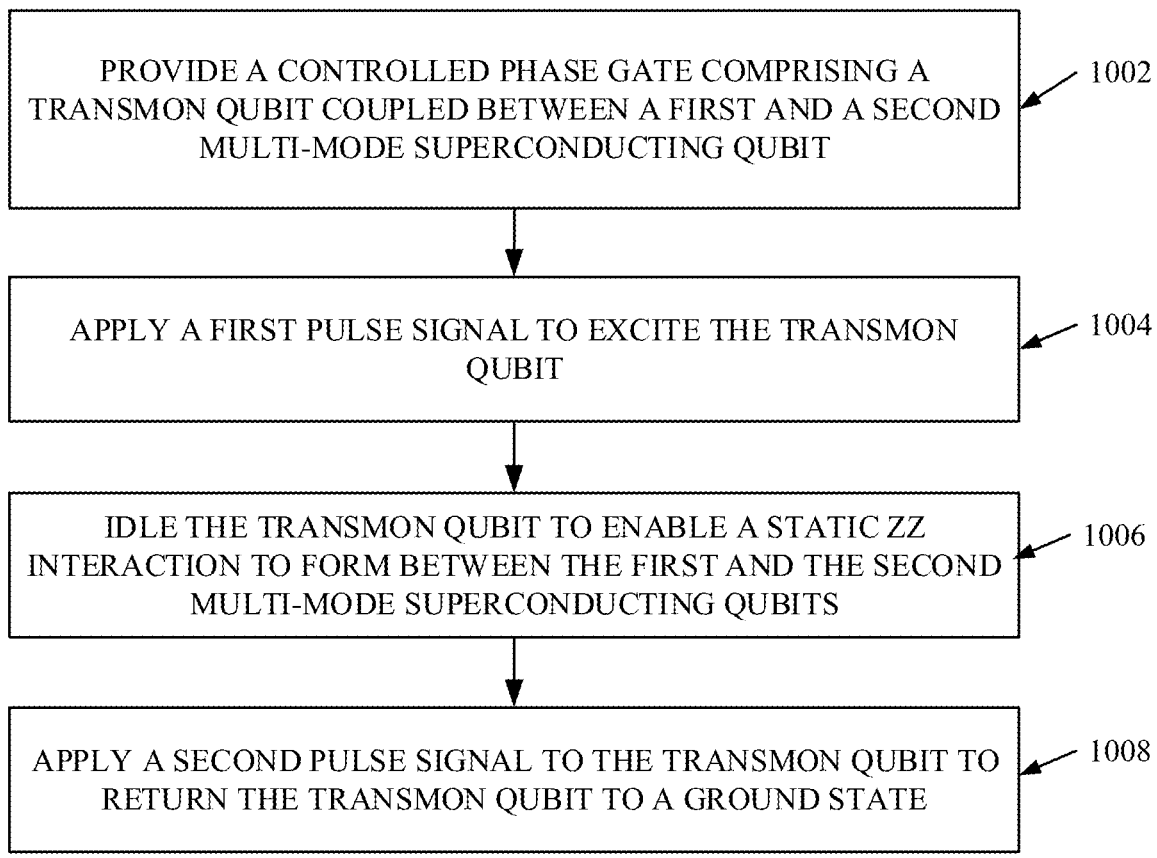
FIG. 10 illustrates a flow diagram of an example, non-limiting method that can facilitate controlling a static ZZ interaction between separate multi-mode superconducting qubits via a transmon coupler in accordance with one or more embodiments described herein.

FIG. 10 illustrates a flow diagram of an example, non-limiting method 1000 that can facilitate controlling the static ZZ interaction between coupled multi-mode superconducting qubits (e.g., the first multi-mode superconducting qubit 104 and the second multi-mode superconducting qubit 106) in accordance with one or more embodiments described herein. Repetitive description of like elements employed in other embodiments described herein is omitted for the sake of brevity.

At 1002, the method 1000 can comprise providing a CPHASE gate comprising a transmon qubit (e.g., transmon coupler 102) coupled between a first multi-mode superconducting qubit 104 and a second multi-mode superconducting qubit 106. For example, the CPHASE gate provided at 1002 can have the architecture of the quantum entangling gate structure 100 described herein. At 1004, the method 1000 can comprise applying a first pulse signal (e.g., of a microwave signal 202) to excite the transmon qubit (e.g., transmon coupler 102). For instance, the applying at 1004 can be performed in accordance with the first stage 402 of the example pulse sequence scheme 400 described herein. At 1006, the method 1000 can comprise idling the transmon qubit (e.g., transmon coupler 102) to enable a static ZZ interaction to form between the first multi-mode superconducting qubit 104 and the second multi-mode superconducting qubit 106. For instance, the idling at 1006 can be performed in accordance with the second stage 404 of the example pulse sequence scheme 400 described herein. In one or more embodiments, the static ZZ interaction can form between the A modes of the first multi-mode superconducting qubit 104 and the second multi-mode superconducting qubit 106. At 1008, the method 1000 can comprise applying a second pulse signal (e.g., of microwave signal 202) to the transmon qubit (e.g., transmon coupler 102) to return the transmon qubit to the ground state. For instance, the applying the second pulse signal at 1008 can be performed in accordance with the third stage 406 of the example pulse sequence scheme 400 described herein. In one or more embodiments, the static ZZ interaction formed at 1006 can be suppressed by returning the transmon qubit (e.g., transmon coupler 102) to the ground state.

It is, of course, not possible to describe every conceivable combination of components, products and/or methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What is claimed is:
1. An apparatus, comprising:
    a first multi-mode superconducting qubit coupled to a second multi-mode superconducting qubit via a trans- mon coupler, wherein the transmon coupler is a single Josephson junction transmon qubit.

2. The apparatus of claim 1, wherein the first multi-mode superconducting qubit and the second multi-mode superconducting qubit both have a first mode and a second mode, wherein the first mode corresponds to an antisymmetric combination of excitations associated with two Josephson junctions, and wherein the second mode corresponds to a symmetric combination of the excitations associated with the two Josephson junctions.

3. The apparatus of claim 1, wherein the transmon coupler is coupled to the first multi-mode superconducting qubit and the second multi-mode superconducting qubit via a direct exchange coupling with the second mode of the first multi-mode superconducting qubit and the second mode of the multi-mode superconducting qubit.

4. The apparatus of claim 1, wherein the first multi-mode superconducting qubit and the second multi-mode superconducting qubit have operating frequencies between 4.6 and 5.0 gigahertz.

5. The apparatus of claim 1, wherein the transmon coupler is capacitively coupled to: a middle superconducting pad of the first multi-mode superconducting qubit, and a middle superconducting pad of the second multi-mode superconducting qubit.

6. The apparatus of claim 1, wherein the first multi-mode superconducting qubit is a first tunable coupler qubit, and wherein the second multi-mode superconducting qubit is a second tunable coupler qubit.

7. A device, comprising:
a transmon coupler coupled to a first multi-mode superconducting qubit and a second multi-mode superconducting qubit, wherein the transmon qubit controls a static ZZ interaction between the first multi-mode superconducting qubit and the second multi-mode superconducting qubit, and the transmon coupler is a single Josephson junction transmon qubit.

8. The device of claim 7, wherein the transmon coupler is capacitively coupled to: a middle superconducting pad of the first multi-mode superconducting qubit, and a middle superconducting pad of the second multi-mode superconducting qubit.

9. The device of claim 7, wherein the first multi-mode superconducting qubit and the second multi-mode superconducting qubit both have a first mode corresponding to an antisymmetric combination of excitations associated with two Josephson junctions and a second mode corresponding to a symmetric combination of excitations associated with the two Josephson junctions.

10. The device of claim 9, wherein the first multi-mode superconducting qubit is a first tunable coupler qubit, and wherein the second multi-mode superconducting qubit is a second tunable coupler qubit.

11. The device of claim 7, wherein the transmon coupler is coupled to the first multi-mode superconducting qubit and the second multi-mode superconducting qubit via a direct exchange coupling with the second mode of the first multi-mode superconducting qubit and the second mode of the multi-mode superconducting qubit.

12. The device of claim 7, wherein the first multi-mode superconducting qubit and the second multi-mode superconducting qubit have operating frequencies between 4.6 and 5.0 gigahertz.

13. A method, comprising:
applying a first pulse signal to a transmon coupler to control a quantum entangling gate between a first multi-mode superconducting qubit and a second multi-mode superconducting qubit, wherein the transmon coupler is a single Josephson junction transmon qubit coupled to the first multi-mode superconducting qubit and the second multi-mode superconducting qubit.

14. The method of claim 13, further comprising:
idling the transmon coupler to enable a static ZZ interaction to form between the first multi-mode superconducting qubit and the second multi-mode superconducting qubit.

15. The method of claim 14, further comprising:
applying a second pulse signal to the transmon qubit, wherein the second pulse signal returns the transmon coupler to a ground state.

16. The method of claim 15, wherein the first pulse signal excites the transmon coupler to an excited state.

17. The method of claim 16, wherein the first multi-mode superconducting qubit and the second multi-mode superconducting qubit both have a mode corresponding to an antisymmetric combination of excitations associated with two Josephson junctions.

18. The method of claim 17, wherein the static ZZ interaction is between the mode of the first multi-mode superconducting qubit and the mode of the second multi-mode superconducting qubit.

19. The method of claim 18, wherein the static ZZ interaction is enhanced by exciting the transmon coupler to the excited state and suppressed by returning the transmon qubit to the ground state.

20. The method of claim 13, wherein the transmon coupler is coupled between middle superconducting pads of the first multi-mode superconducting qubit and the second multi-mode superconducting qubit.

* * * * *